(12) United States Patent
Kubo (10) Patent No.: US 10,837,104 B2
(45) Date of Patent: Nov. 17, 2020

(54) COATED TOOL (71) Applicant: Kyocera Corporation, Kyoto (JP)

(72) Inventor: Hayato Kubo, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 144 days.

(21) Appl. No.: 15/755,589

(22) PCT Filed: Aug. 29, 2016

(86) PCT No.: PCT/JP2016/075187
§ 371 (c)(1),
(2) Date: Feb. 27, 2018

(87) PCT Pub. No.: WO2017/038762
PCT Pub. Date: Mar. 9, 2017

(65) Prior Publication Data
US 2019/0010606 A1    Jan. 10, 2019

(30) Foreign Application Priority Data
Aug. 29, 2015 (JP) .................. 2015-169886

(51) Int. Cl.
*B32B 27/14* (2006.01)
*C23C 16/36* (2006.01)
(Continued)

(52) U.S. Cl.
CPC ............ *C23C 16/36* (2013.01); *B23B 27/148* (2013.01); *C23C 16/0272* (2013.01);
(Continued)

(58) Field of Classification Search
USPC ........... 51/307, 309; 407/119; 428/216, 336, 428/697, 698, 699, 701, 702
See application file for complete search history.

(56) References Cited

U.S. PATENT DOCUMENTS

RE39,884 E * 10/2007 Ostlund .................. C22C 29/08
51/307
RE39,999 E * 1/2008 Lindskog ................ C22C 29/08
428/336

(Continued)

FOREIGN PATENT DOCUMENTS

JP    2007-260851    * 10/2007
JP    2011152602 A    8/2011
(Continued)

OTHER PUBLICATIONS

International Search Report received for International Application No. PCT/JP2016/075187 dated Oct. 25, 2016, 1 page.

*Primary Examiner* — Archene A Turner
(74) *Attorney, Agent, or Firm* — Viering, Jentschura & Partner mbB (57) ABSTRACT

A cutting tool in an embodiment includes a base member composed of cemented carbide and a coating layer located on a surface of the base member. The coating layer includes a first layer which is in contact with the base member and contains $Ti(C_xN_{1-x})$ ($0 \leq x \leq 1$). A KAM average value of WC particles in a region extending to a depth of 5 μm from the surface of the base member is 1° or less, which is measured by electron backscatter diffraction (EBSD) method using a scanning electron microscope with an electron backscatter diffraction imaging system.

7 Claims, 2 Drawing Sheets

(51) Int. Cl.
   *C23C 16/02*    (2006.01)
   *C23C 16/34*    (2006.01)
   *C23C 28/04*    (2006.01)
   *B23B 27/14*    (2006.01)
   *C23C 16/40*    (2006.01)

(52) U.S. Cl.
   CPC ............ *C23C 16/34* (2013.01); *C23C 16/403* (2013.01); *C23C 28/042* (2013.01); *C23C 28/044* (2013.01); *B23B 2224/04* (2013.01); *B23B 2224/32* (2013.01)

(56) References Cited

U.S. PATENT DOCUMENTS

| | | | | |
|---|---|---|---|---|
| 2008/0050614 A1* | 2/2008 | Holzschuh | ............ | C23C 30/005 |
| | | | | 428/701 |
| 2008/0057280 A1* | 3/2008 | Watanabe | ............... | C23C 16/36 |
| | | | | 428/698 |
| 2009/0214306 A1* | 8/2009 | Sundstrom | ............. | C23C 16/30 |
| | | | | 407/119 |
| 2012/0144753 A1* | 6/2012 | Okuno | .................... | C22C 29/08 |
| | | | | 51/309 |
| 2013/0022418 A1* | 1/2013 | Fukano | .................. | B23C 5/202 |
| | | | | 407/119 |
| 2014/0127527 A1* | 5/2014 | Kinoshita | ............. | B22F 3/1007 |
| | | | | 428/698 |
| 2016/0008891 A1 | 1/2016 | Makino | | |

FOREIGN PATENT DOCUMENTS

| | | | |
|---|---|---|---|
| JP | 2014184521 A | | 10/2014 |
| JP | 2014223722 A | | 12/2014 |
| JP | 2015101747 A | | 6/2015 |
| KR | 201001305641 | * | 12/2010 |

\* cited by examiner

COATED TOOL

RELATED APPLICATIONS

The present application is a national stage entry according to 35 U.S.C. § 371 of PCT application No.: PCT/JP2016/075187 filed on Aug. 29, 2016, which claims priority from Japanese application No.: 2015-169886 filed on Aug. 29, 2015 and is incorporated herein by reference in its entirety.

TECHNICAL FIELD

The present embodiment relates to a coated tool having a coating layer on a surface of a base member.

BACKGROUND ART

Coated tools have conventionally been known in which, for example, at least one titanium carbide layer, at least one titanium nitride layer, at least one titanium carbonitride layer, at least one aluminum oxide layer, and at least one titanium aluminum nitride layer are deposited on a surface of a base member composed of cemented carbide.

The coated tools need enhancement of wear resistance and fracture resistance. For example, higher efficiency of a cutting process increases opportunities for using a cutting tool in an interrupted heavy cutting process or the like, during which a large impact is exerted on a cutting edge. Under such severe cutting conditions, there is a desire to prevent chipping and peeling-off of a coating layer due to a large impact exerted on the coating layer.

Japanese Patent 2011-152602 (Patent Document 1) discloses a cutting tool with a titanium nitride layer deposited as a coating layer on a surface of a base member by physical vapor deposition. This patent also discloses that crystal orientations of titanium nitride crystal grains on a surface of the coating layer, which are obtainable by measurement using an electron backscatter diffraction (EBSD) system, are controlled within a predetermined range.

SUMMARY

A cutting tool in an embodiment includes a base member composed of cemented carbide and a coating layer located on a surface of the base member. The coating layer includes a first layer which is in contact with the base member and contains $Ti(C_xN_{1-x})$ ($0 \leq x \leq 1$). A KAM (Karnel Average Misorientation) average value of WC particles in a region extending to a depth of 5 μm from the surface of the base member is 1° or less, which is measured by electron backscatter diffraction (EBSD) method using a scanning electron microscope with an electron backscatter diffraction imaging system.

EMBODIMENT

Figure 1:
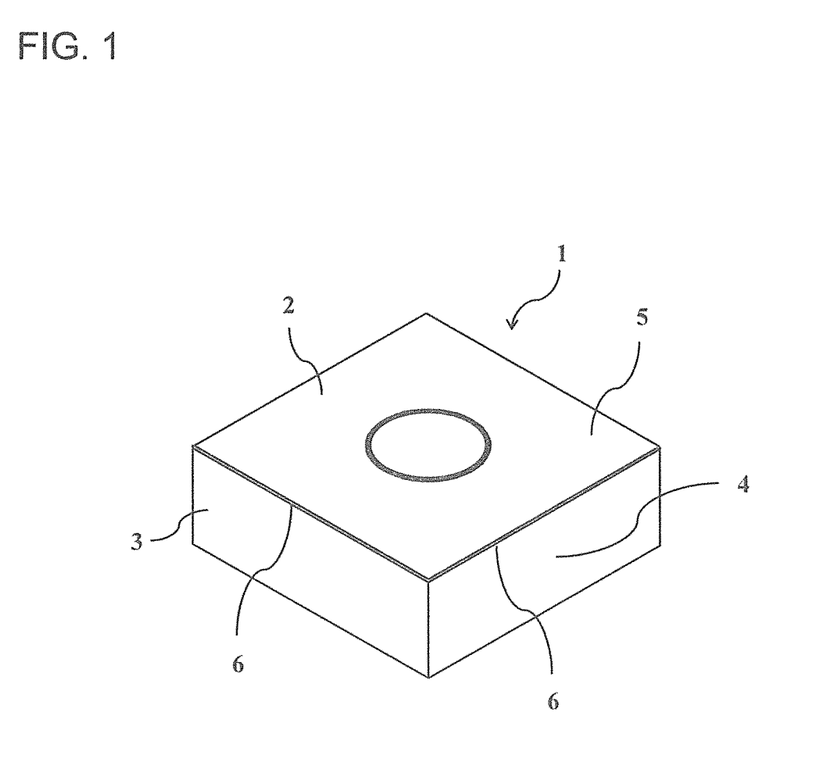
FIG. 1 is a schematic perspective view of a cutting tool in an embodiment.
Figure 2:
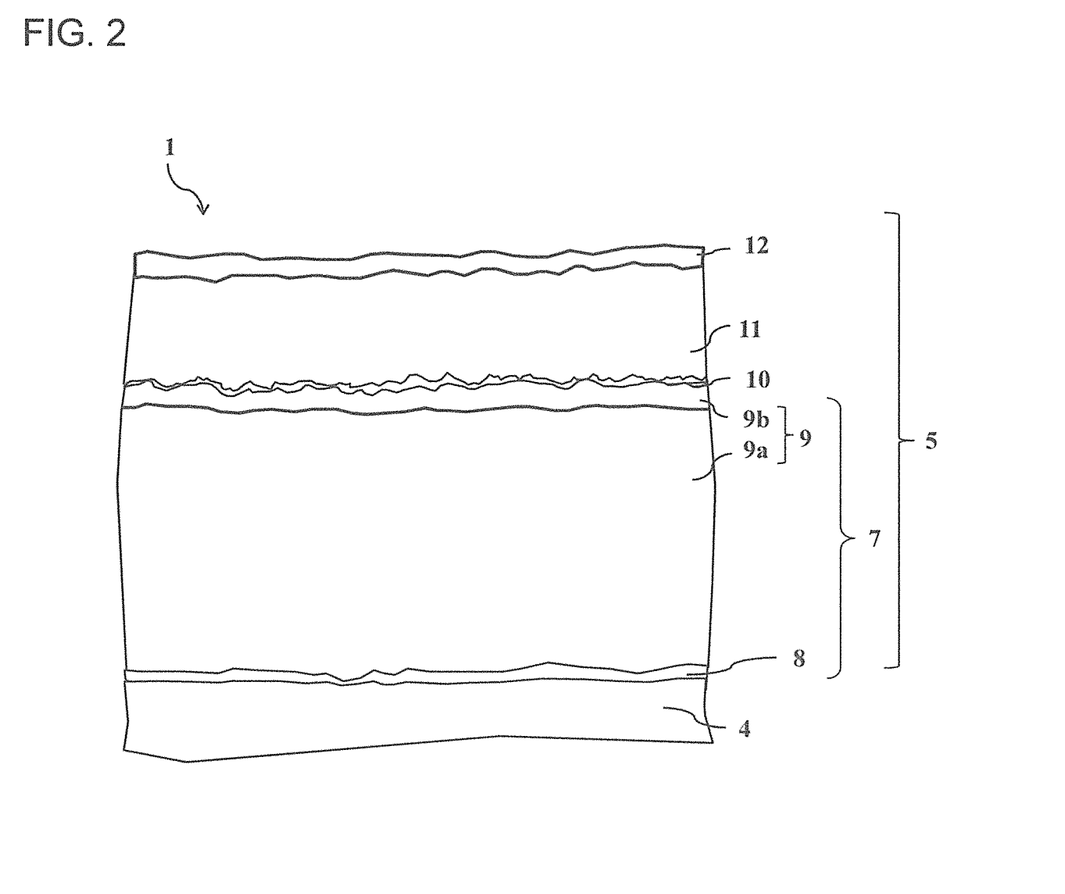
FIG. 2 is a schematic sectional view of the cutting tool illustrated in FIG. 1.

A coated tool needs to be usable under more severe machining conditions in order to increase machining efficiency. There is a desire that a coating layer is less susceptible to chipping and peeling off by enhancing adhesion between a base member composed of cemented carbide and the coating layer. A cutting tool (hereinafter referred to simply as a tool) 1 is illustrated as an embodiment of the coated tool that meets these needs. As illustrated in FIG. 1, the tool 1 includes a first surface 2 (an upper surface in FIG. 1) and a second surface 3 (a side surface in FIG. 1). As illustrated in FIG. 2, the tool 1 includes a base member 4 and a coating layer 5 located on the base member 4.

In the tool 1 illustrated in FIG. 1, at least a part of the first surface 2 functions as a rake surface, and at least a part of the second surface 3 functions as a flank surface. At least a part of a ridge line where the first surface 2 intersects with the second surface 3 constitutes a cutting edge 6.

The base member 4 is composed of cemented carbide. Examples of compositions of the cemented carbide include WC—Co, WC—TiC—Co, and WC—TiC—TaC—Co. Here, WC (tungsten carbide), TiC (titanium carbide), TaC (tantalum carbide) are hard particles, and Co (cobalt) is a binder phase. The above compositions are examples. Alternatively, the base member 4 may have other structure made up of WC particles, at least one kind of hard phase selected from the group consisting of carbides, nitrides, and carbonitrides of metals of Groups 4, 5, and 6 in the periodic table, and a binder phase composed of Co.

The coating layer 5 includes a first layer 7 in contact with the base member 4. The first layer 7 contains $Ti(C_xN_{1-x})$ ($0 \leq x \leq 1$).

In the present embodiment, a KAM average value of WC particles in a region extending to a depth of 5 μm from a surface of the base member 4 is 1° or less, which is measured by EBSD method using a scanning electron microscope with an electron backscatter diffraction imaging system. The KAM average value having the above value leads to a smaller deformation volume of the WC particles existing on the surface of the base member 4, resulting in a smaller residual stress between the base member 4 and the first layer 7. Consequently, the adhesion between the base member 4 and the coating layer 5 can be enhanced to improve peeling resistance of the coating layer 5, so that the coating layer 5 is less susceptible to chipping. When the KAM average value is 0.8° or less, it is possible to further enhance the adhesion between the base member 4 and the coating layer 5.

The KAM (Karnel Average Misorientation) indicates a local orientation difference that is a crystal orientation difference between adjacent measurement points measured by the EBSD method. The KAM value is a value having correlation with a magnitude, such as plastic strain. The KAM reflects local deformation and dislocation density on a microscopic level, therefore local plastic deformation on the microscopic level is observable by measuring the KAM value. The KAM average value is obtainable by measuring KAM values at individual positions in an observation region, and then averaging the KAM values.

In the step of depositing a conventional coating layer, distortion may occur between a base member composed of cemented carbide and the coating layer in contact with the base member. It is thought the cause of the distortion is that the surface of the base member is deformed in the step of depositing the coating layer by carbon decreases in a region near a surface of the base member than inside the base member. Due to the deformation of the surface of the base member, minute plastic strain is apt to remain in part of the WC particles existing on the surface of the base member. Therefore, when an impact is applied to the coated tool, the coating layer may easily peel off from the base member.

In the present embodiment, the strain between the base member 4 and the coating layer 5 is reduced by controlling a decrease in carbon content in the region near the surface of the base member 4 with respect to the inside of the base member 4. By so controlling the decrease in carbon content, the KAM average value becomes 1° or less.

Alternatively, the base member 4 in the present embodiment may be so designed that a ratio of a carbon content in a region extending to a depth of 5 μm from the surface to a carbon content in a region extending to a depth of 200 μm or more from the surface is from 0.95 to 1. In other words, the base member 4 may be so designed that a decrease in the carbon content in the region extending to the depth of 5 μm from the surface, which is located immediately below the coating layer 5, is 5% by mass or less with respect to the carbon content in the region extending to the depth of 200 μm or more from the surface. The adhesion between the base member 4 and the coating layer 5 is further improved when satisfying the above structure.

The distortion between the base member 4 and the coating layer 5 is reduced because the minute plastic strain that occurs in the WC particles existing near the surface of the base member 4 is controlled in the present embodiment. Consequently, even when a large impact is exerted on the tool 1, the coating layer 5 is less likely to peel off from the base member 4.

Although a thickness of the first layer 7 is not particularly limited, the thickness is settable to, for example, 6-15 μm. The wear resistance can be enhanced when the thickness of the first layer 7 is 6 μm or more, particularly 10 μm or more. The fracture resistance can be enhanced when the thickness of the first layer 7 is 15 μm or less, particularly 13 μm or less.

Although the first layer 7 containing $Ti(C_xN_{1-x})$ ($0 \leq x \leq 1$) may be composed of a single layer, the first layer 7 is made up of two regions stacked one upon another in the present embodiment. Specifically, the first layer 7 includes a first region 8 in contact with the base member 4, and a second region 9 located on the first region 8.

A carbon content in the first region 8 may be smaller than a carbon content in the second region 9 in the tool 1 of the present embodiment. Specifically, the first region 8 is composed mainly of titanium nitride (TiN), and the second region 9 is composed mainly of titanium carbonitride (Ti($C_xN_{1-x}$)) ($0<x<1$)). The adhesion between the base member 4 and the first layer 7 can be further enhanced when the first layer 7 has the above structure. Particularly, when the first region 8 in the first layer 7 is composed of TiN, ingredients of the cemented carbide are less likely to diffuse from the base member 4 toward the coating layer 5, and hence the surface of the base member 4 is less likely to deform.

The first region 8 in the present embodiment is composed of titanium nitride particles having a mean particle diameter of 0.05-0.5 μm, and the titanium nitride particles are made into columnar crystals extending in a direction perpendicular to the surface of the base member 4.

In the present embodiment, epitaxial growth takes place on a region between the WC particles located on the surface of the base member 4 and the titanium nitride particles located at a side of the base member 4 in the first region 8. Additionally, Co is diffused at a ratio of 0.2-3% by mass in the first region 8. The adhesion between the base member 4 and the coating layer 5 can be further enhanced when Co is so diffused.

The second region 9 in the present embodiment is made up of a layer 9a composed mainly of so-called MT (Moderate Temperature)-titanium carbonitride, and a layer 9b located on the layer 9a and composed mainly of HT (High Temperature)-titanium carbonitride.

The layer 9a is composed of columnar crystals and a raw material of the layer 9a contains a acetonitrile ($CH_3CN$) gas, and which are deposited at a deposition temperature that is a relatively low temperature of 780-900° C. Here, a width of the columnar crystals in a direction parallel to the surface of the base member 4 is 0.4 μm or less. The adhesion between the base member 4 and the first region 8 can be further enhanced when the columnar crystals have the above structure. The layer 9b is composed of granular crystals deposited at a deposition temperature that is a relatively high temperature of 950-1100° C.

Projections tapered upward in a triangle shape in a sectional view are provided on a surface of the layer 9b. When these projections are provided, adhesion to a second layer 10 described later can be enhanced to ensure that the coating layer 5 is less susceptible to peeling and chipping.

Although a thickness of the first region 8 is not particularly limited, the thickness is settable to, for example, 0.5-3 μm. Although a thickness of the second region 9 is also not particularly limited, the thickness is settable to, for example, 5.5-14.5 μm. Adhesion of the coating layer 5 to the base member 4 can be further enhanced, and the wear resistance can also be enhanced when the thickness of the first region 8 is 0.5-3 μm, particularly 0.5-2.0 μm, and the thickness of the second region 9 is 5.5-14.5 μm, particularly 8.0-12.5 μm.

The coating layer 5 in the present embodiment further includes a second layer 10 and a third layer 11 in addition to the first layer 7. The second layer 10 is located on the first layer 7, and the third layer 11 is located on the second layer 10. The second layer 10 is located on the layer 9b.

The second layer 10 contains titanium and oxygen, and is composed of, for example, TiCO, TiNO, TiCNO, TiAlCO, or TiAlCNO. Specifically, the second layer 10 in the present embodiment contains $Ti(C_xN_{1-x-y}O_y)$ ($0<x<1$, $0<y<1$). The third layer 11 contains aluminum oxide.

The wear resistance of the coating layer 6 can be further enhanced when provided with the third layer 11. Furthermore, adhesion between the first layer 7 and the third layer 11 can be enhanced when the second layer 10 is located between the first layer 7 and the third layer 11.

Aluminum oxide particles constituting the third layer 11 have an α-type crystal structure when the second layer 10 contains the above ingredient. The third layer 11 composed of the aluminum oxide having the α-type crystal structure has high hardness. It is therefore possible to enhance the wear resistance of the coating layer 6.

When the second layer 10 contains $Ti(C_xN_{1-x-y}O_y)$ and $x+y=1$, the $Ti(C_xN_{1-x-y}O_y)$ in the second layer 10 has a needle shape and a crystal structure extending up to a height of 0.05-0.5 μm in the direction perpendicular to the surface of the base member 4. This structure contributes to enhancing adhesion between the second region 9 and the third layer 11.

When the third layer 11 is composed of the aluminum oxide having the α-type crystal structure, hardness of the third layer 11 can be enhanced to improve the wear resistance of the tool 1. Specifically, the coating layer 5 is less susceptible to wear when I (116) and I (104) are respectively first and second strongest ones among peaks detectable from a surface side of the third layer 11 by an X-ray diffraction measurement.

Thicknesses of the individual layers and properties of the crystals constituting the individual layers are measurable by observing an electron microscope photograph (scanning electron microscope (SEM) photograph or transmission electron microscope (TEM) photograph) in a cross section of the tool 1. In the present embodiment, the fact that the crystals constituting the individual layers of the coating layer 5 have the columnar shape denotes a state in which a ratio of a mean crystal width to a length of each crystal in a thickness direction of the coating layer 5 is 0.3 or less on average. Meanwhile, crystals, whose ratio of the mean crystal width to the length of each crystal in the thickness direction of the coating layer 5 exceeds 0.3, are defined as having a granular shape.

The coating layer 5 in the present embodiment further includes a fourth layer 12 in addition to the first layer 7, the second layer 10, and the third layer 11. The fourth layer 12 is located on the third layer 11. The fourth layer 12 contains $Ti(C_xN_{1-x-y}O_y)$ ($0 \leq x \leq 1$, $0 \leq y \leq 1$). The fourth layer 12 may be composed of any other material, such as chromium nitride. The fourth layer 12 in the present embodiment is deposited to a thickness of 0.1-3 µm.

The coating layer 6 of the present embodiment is one in which the second region 9, the second layer 10, the third layer 11, and the fourth layer 12, each being composed of the titanium carbonitride layer, are stacked one upon another in this order from a side of the base material 4.

The tool 1 is designed to carry out a cutting process by bringing the cutting edge 6, which is disposed along at least apart of the ridge line where the rake surface intersects with the flank surface, into contact with a workpiece. The tool 1 is thus capable of producing the excellent effects described above. The tool 1 of the present embodiment is also applicable to a variety of uses besides cutting tools, such as digging tools and edge tools. The tool 1 also produces excellent mechanical reliability in these uses.

A method of manufacturing the coated tool in the present embodiment is described below with reference to an example of the method of manufacturing the tool 1.

Firstly, metal powder, carbon powder, or the like are suitably added to inorganic powder of metal carbide, nitride, carbonitride, oxide, or the like, which are capable of forming a hard alloy constituting the base member 4 by sintering, and these are mixed together. This mixed powder is then molded into a predetermined tool shape by a known molding method, such as press molding, casting molding, extrusion molding, and cold isostatic pressing. This is then subjected to sintering in vacuum or a non-oxidizing atmosphere, thereby manufacturing the base member 4 composed of the above hard alloy. A surface of the base member 4 is then subjected to polishing process, and a cutting part is subjected to honing process if desired.

Subsequently, a coating layer is deposited on the surface by chemical vapor deposition (CVD) method.

Firstly, the base member 4 composed of the cemented carbide is subjected to a pretreatment at a film deposition temperature of 700-800° C. and 5-50 kPa by preparing a mixed gas made up of 1-5% by volume of carbon monoxide (CO) gas and the rest, namely, hydrogen ($H_2$) gas, and then by admitting the mixed gas into a chamber. A carbon content ratio in the surface of the base member 4 is increased by the pretreatment. Consequently, when subsequently depositing the first layer 7, carbon ingredients are less likely to diffuse and move toward the first layer 7 on the surface of the base member 4, so that large distortion is less likely to occur in the WC particles in the surface of the base member 4.

Subsequently, the first region 8 composed mainly of titanium nitride (TiN) is deposited at a film deposition temperature of 800-940° C. and 8-50 kPa by preparing a mixed gas in which a reaction gas composition is made up of 0.5-10% by volume of titanium tetrachloride ($TiCl_4$) gas, 10-60% by volume of nitrogen ($N_2$) gas, and the rest, namely, hydrogen ($H_2$) gas, and then by admitting the mixed gas into the chamber. Here, a film deposition start temperature is controlled at a temperature lower than a film deposition temperature at the termination of the film deposition by 10-50° C., and the temperature is increased during the film deposition. This ensures that W and Co elements in the surface of the base member are less likely to diffuse and large distortion is less likely to occur in the WC particles in the surface of the base member 4.

Thereafter, the second region 9 is deposited. Firstly, the layer 9a composed mainly of MT-titanium carbonitride is deposited at a film deposition temperature of 780-880° C. and 5-25 kPa by preparing a mixed gas in which a reaction gas composition is made up of 0.5-10% by volume of titanium tetrachloride ($TiCl_4$) gas, 5-60% by volume of nitrogen ($N_2$) gas, 0.1-3.0% by volume of acetonitrile ($CH_3CN$) gas, and the rest, namely, hydrogen ($H_2$) gas, and then by admitting the mixed gas into the chamber. Here, a mean crystal width of columnar crystals of titanium carbonitride constituting the layer 9a can be made larger on a side of the surface than on a side of the base member 4 by increasing a content ratio of the acetonitrile ($CH_3CN$) gas in a later stage of the film deposition than in an initial stage of the film deposition.

Subsequently, the layer 9b composed mainly of HT-titanium carbonitride which constitutes the second region 9 is deposited. In the present embodiment, an HT-titanium carbonitride layer is deposited under specific deposition conditions. The deposition is carried out at a film deposition temperature of 900-1050° C. and 5-40 kPa by preparing a mixed gas made up of 1-4% by volume of titanium tetrachloride ($TiCl_4$) gas, 5-20% by volume of nitrogen ($N_2$) gas, 0.1-10% by volume of methane ($CH_4$) gas, and the rest, namely, hydrogen ($H_2$) gas, and then by admitting the mixed gas into the chamber.

Furthermore, the second layer 10 is deposited. Specific deposition conditions in the present embodiment are as follows. The deposition is carried out at a film deposition temperature of 900-1050° C. and 5-40 kPa by preparing a mixed gas made up of 3-15% by volume of titanium tetrachloride ($TiCl_4$) gas, 3-10% by volume of methane ($CH_4$) gas, 10-25% by volume of nitrogen ($N_2$) gas, 0.5-2.0% by volume of carbon monoxide (CO) gas, and the rest, namely, hydrogen ($H_2$) gas, and then by admitting the mixed gas into the chamber. In this step, the nitrogen gas ($N_2$) gas may be changed to argon (Ar) gas. By this step, the needle shaped crystals extending in the direction perpendicular to the surface of the base member 4 are generated in the second layer 10, thereby enhancing adhesion to the third layer 11 to be deposited subsequently.

Thereafter, the third layer 11 is deposited. Firstly, aluminum oxide crystal cores are formed at 950-1100° C. and 5-40 kPa by using a mixed gas made up of 5-10% by volume of aluminum trichloride ($AlCl_3$) gas, 0.1-1.0% by volume of hydrogen chloride (HCl) gas, 0.1-5.0% by volume of carbon dioxide ($CO_2$) gas, and the rest, namely, hydrogen ($H_2$) gas.

Subsequently, another deposition is carried out at 950-1100° C. and 5-20 kPa by using a mixed gas made up of 0.5-5.0% by volume of aluminum trichloride ($AlCl_3$) gas, 1.5-5.0% by volume of hydrogen chloride (HCl) gas, 0.5-5.0% by volume of carbon dioxide ($CO_2$) gas, 0-1.0% by volume of hydrogen sulfide ($H_2S$) gas, and the rest, namely, hydrogen ($H_2$) gas. In this second stage deposition process, a growth state of aluminum oxide crystals deposited at a side of the third layer 11 which is close to the second layer 10 is adjusted to control orientations of the aluminum oxide crystals.

Subsequently, an aluminum oxide is deposited at 950-1100° C. and 5-20 kPa by using a mixed gas made up of 5-15% by volume of aluminum trichloride ($AlCl_3$) gas, 0.5-2.5% by volume of hydrogen chloride (HCl) gas, 0.5-5.0% by volume of carbon dioxide ($CO_2$) gas, 0.1-1.0% by volume of hydrogen sulfide ($H_2S$) gas, and the rest, namely, hydrogen ($H_2$) gas. In this third stage deposition process, a growth state of aluminum oxide crystals deposited at a surface side of the third layer 11 is adjusted to control orientations of the aluminum oxide crystals. The second stage and the third stage in the deposition process of the third layer 11 may be one in which the composition of the mixed gas is changed continuously, instead of being independent processes.

If desired, the fourth layer 12 is deposited. When the fourth layer 12 is composed of TiN, specific deposition conditions are as follows. That is, a deposition is carried out at a film deposition temperature of 960-1100° C. and 10-85 kPa by preparing, as a reaction gas composition, a mixed gas made up of 0.1-10% by volume of titanium tetrachloride ($TiCl_4$) gas, 10-60% by volume of nitrogen ($N_2$) gas, and the rest, namely, hydrogen ($H_2$) gas, and then by admitting the mixed gas into the chamber.

Thereafter, if desired, a polishing process is carried out on at least a part of the surface of the deposited coating layer 5 at which the cutting edge 6 is located. The polishing process makes the cutting edge 6 smooth, and a workpiece is less likely to be welded, thus leading to the tool with more excellent fracture resistance.

EXAMPLES

Firstly, an amount of 6% by mass of metal cobalt powder having a mean particle diameter of 1.2 μm, an amount of 0.5% by mass of titanium carbide powder having a mean particle diameter of 2.0 μm, an amount of 5% by mass of niobium carbide powder having a mean particle diameter of 2.0 μm, and the rest, namely, tungsten carbide powder having a mean particle diameter of 1.5 μm were added and mixed together. This was molded into a tool shape (CNMG120408) by press molding, followed by a debindering process. This was then sintered in vacuum at 1500° C. and 0.01 Pa for one hour, thereby manufacturing a base member composed of cemented carbide. The manufactured base member was then subjected to a brushing process, and a part of the base member which served as a cutting edge was subjected to round honing.

A cutting tool was manufactured by depositing a coating layer on the base member of cemented carbide by chemical vapor deposition (CVD) method under film deposition conditions in Table 1. Compounds are represented by their chemical symbols in Tables 1 and 2.

Firstly, the rake surface in the above sample was subjected to an X-ray diffraction analysis using CuKα ray without polishing the coating layer. A peak having the highest strength and a peak having the second highest strength among obtained diffraction peaks were observed.

A fracture surface of the tool was observed with a scanning electron microscope (SEM), and a thickness of each of the layers was measured. A KAM measurement by EBSD method was carried out as follows.

Across section of the cutting tool was subjected to buff polishing using choroidal silica, and a measurement region was divided into square regions (pixels) by using an EBSD (model number JSM7000F) manufactured by Oxford Instruments. Orientations of the pixels in each of the divided regions were measured by obtaining a Kikuchi pattern from a backscattered electron of an electron beam being incident on the surface of the sample. Measured orientation data were analyzed using analysis software incorporated into the same system, and various parameters were calculated.

Observation conditions were as follows. An acceleration voltage was 15 kV. A measurement area was 60 μm wide×5 μm deep on the surface of the cemented carbide that was the base member. A distance between the pixels adjacent to each other (step size) was set to 0.1 μm. Ones whose orientation difference between the pixels adjacent to each other was 5° or more were regarded as crystal grain boundaries. In terms of KAM, an average value of orientation differences between the pixels within the crystal grain and adjacent pixels existing in a range not exceeding the crystal boundaries was calculated, and a KAM average value was measured as an average value of all the pixels constituting the entire measurement area. In the measurement of the KAM average value, arbitrary three viewing fields were measured, and their average value was evaluated. The results were presented in Tables 2 and 3.

Then, a continuous cutting test and an intermittent cutting test were conducted with the obtained cutting tool under the following conditions. Wear resistance and fracture resistance were evaluated. The results were presented in Table 3.

(Continuous Cutting Conditions)
Workpiece: Chromium molybdenum steel (SCM435)
Tool shape: CNMG120408
Cutting speed: 300 m/min
Feed rate: 0.30 mm/rev
Depth of Cut 1.5 mm
Cutting Time: 25 minutes
Others: Using water-soluble cutting fluid
Evaluation items: A cutting edge honing portion was observed by a scanning electron microscope, and a flank wear width on the flank surface in an actually worn portion was measured.

(Intermittent Cutting Conditions)
Workpiece: chromium molybdenum steel with four flutes (SCM440)
Tool shape: CNMG120408
Cutting speed: 300 m/min
Feed rate: 0.30 mm/rev
Depth of Cut 1.5 mm
Others: Using water-soluble cutting fluid
Evaluation item: The number of impacts before reaching a fracture was measured.

TABLE 1

| Coating layer | Mixed gas composition (% by volume) | Chamber temperature (° C.) | Pressure (kPa) |
| --- | --- | --- | --- |
| Heat treatment | CO: 2.5, $H_2$: balance | 750 | 10 |
| TiN-1 | $TiCl_4$: 2.5, $N_2$: 23, $H_2$: balance | 800→850 | 16 |

TABLE 1-continued

| Coating layer | Mixed gas composition (% by volume) | Chamber temperature (° C.) | Pressure (kPa) |
|---|---|---|---|
| TiN-2 | TiCl4: 2.5, N2: 23, H2: balance | 900 | 16 |
| TiCN-1(MT) | TiCl$_4$: 1.0, N$_2$: 10, CH$_3$CN: 0.1→0.4, H$_2$: balance | 850 | 9 |
| TiCN-2(HT) | TiCl$_4$: 1.0, N$_2$: 10, CH$_4$: 2.0, H$_2$: balance | 1010 | 9 |
| TiCO-1 | TiCl$_4$: 7.0, CH$_4$: 5.5, CO: 0.5, H$_2$: balance | 1000 | 15 |
| TiCNO-1 | TiCl$_4$: 7.0, CH$_4$: 3.5, N$_2$: 15.0, CO: 1.0, H$_2$: balance | 1000 | 15 |
| Al$_2$O$_3$-1 | AlCl$_3$: 8.0, HCl: 0.5, CO$_2$: 1.0, H$_2$: balance | 1000 | 10 |
| Al$_2$O$_3$-2 | AlCl$_3$: 3.5, HCl: 2.0, CO$_2$: 1.0, H$_2$S: 0.5, H$_2$: balance | 1000 | 10 |
| Al$_2$O$_3$-3 | AlCl$_3$: 7.0, HCl: 1.0, CO$_2$: 1.0, H$_2$S: 0.5, H$_2$: balance | 1000 | 10 |
| Al$_2$O$_3$-4 | AlCl$_3$: 2.5→5.0, HCl: 2.0→0.5, CO$_2$: 1.3, H$_2$S: 0.1, H$_2$: balance | 1000 | 10 |
| Al$_2$O$_3$-5 | AlCl$_3$: 6.5, HCl: 1.0, CO$_2$: 1.5, H$_2$: balance | 1000 | 10 |
| Al$_2$O$_3$-6 | AlCl$_3$: 6.0, HCl: 1.0, CO$_2$: 1.2, H$_2$S: 0.4, H$_2$: balance | 1000 | 10 |
| Al$_2$O$_3$-7 | AlCl$_3$: 4.0, HCl: 2.0, CO$_2$: 3.0, H$_2$S: 0.7, H$_2$: balance | 970 | 20 |
| Al$_2$O$_3$-8 | AlCl$_3$: 8.0, HCl: 0.5, CO$_2$: 3.0, H$_2$S: 0.6, H$_2$: balance | 1050 | 10 |
| Al$_2$O$_3$-9 | AlCl$_3$: 5.0→12, HCl: 2.0→1.5, CO$_2$: 3.0, H$_2$S: 0.3, H$_2$: balance | 990 | 10 |
| TiN-3 | TiCl$_4$: 2.0, N$_2$: 40, H$_2$: balance | 1010 | 30 |

*TiCN-1(MT), Al$_2$O$_3$-4, Al$_2$O$_3$-9: The additional amount of each gas (AlCl$_3$, CH$_3$CN, HCl) was changed continuously from x to y.
*The chamber temperature of TiN-1 was increased continuously from 800° C. to 850° C.

TABLE 2

| | | | Coating layer*[1] | | | | | | |
|---|---|---|---|---|---|---|---|---|---|
| | | | Second region | First layer | | | | | |
| Sample No. | Heat treatment | First region | Layer 9a | Layer 9b | thickness (μm) | Second layer | Third layer | | Fourth layer |
| 1 | Yes | TiN-1 (0.2) | TiCN-1 (15.5) | TiCN-2 (0.2) | 15.9 | TiCNO-1 (0.1) | Al$_2$O$_3$-1 (<0.1) | Al$_2$O$_3$-2 (2) Al$_2$O$_3$-3 (5) | — |
| 2 | Yes | TiN-1 (1) | TiCN-1 (13.0) | TiCN-2 (0.5) | 14.5 | TiCO-1 (0.1) | Al$_2$O$_3$-1 (<0.1) | Al$_2$O$_3$-4 (7) | TiN-3 (2) |
| 3 | Yes | TiN-1 (0.5) | TiCN-1 (5.5) | TiCN-2 (0.1) | 6.1 | TiCO-1 (0.05) | Al$_2$O$_3$-5 (<0.1) | Al$_2$O$_3$-2 (3) Al$_2$O$_3$-6 (4) | TIN-3 (1.5) |
| 4 | Yes | TiN-1 (2) | TiCN-1 (8) | TiCN-2 (0.3) | 10.3 | TiCO-1 (0.1) | Al$_2$O$_3$-1 (<0.1) | Al$_2$O$_3$-7 (1) Al$_2$O$_3$-8 (6) | TiN-3 (1) |
| 5 | Yes | — | TiCN-1 (5) | TiCN-2 (0.5) | 5.5 | TiCNO-1 (0.5) | Al$_2$O$_3$-1 (<0.1) | Al$_2$O$_3$-9 (7) | TiN-3 (3) |
| 6 | Yes | TiN-2 (1) | TiCN-1 (6) | TiCN-2 (0.5) | 7.5 | TiCNO-1 (0.1) | Al$_2$O$_3$-2 (7) | | TiN-3 (1) |
| 7 | No | TiN-1 (0.5) | TiCN-1 (9) | TiCN-2 (0.1) | 9.6 | TiCNO-1 (0.1) | Al$_2$O$_3$-5 (<0.1) | Al$_2$O$_3$-3 (2) Al$_2$O$_3$-2 (5) | TiN-3 (0.5) |

*[1]Values in paretheses represent the layer thickness in μm.

TABLE 3

| | KAM | XRD peak | | Cutting performance | |
|---|---|---|---|---|---|
| Sample No. | average value (°) | First most-intense peak | Second most-intense peak | Flank wear width Vb (mm) | Number of impacts (times) |
| 1 | 0.8 | (104) | (116) | 0.16 | 3100 |
| 2 | 0.5 | (116) | (104) | 0.12 | 3500 |
| 3 | 0.6 | (104) | (116) | 0.16 | 3400 |
| 4 | 0.4 | (104) | (116) | 0.09 | 3750 |
| 5 | 1 | (110) | (104) | 0.22 | 3000 |
| 6 | 1.3 | (104) | (012) | 0.32 | 2600 |
| 7 | 1.8 | (012) | (110) | 0.44 | 2300 |

According to the results of Tables 1 to 3, little or no peeling occurs in the coating layer, a flank wear width is smaller, and the number of impacts is increased in Sample Nos. 1 to 5, whose KAM average value is 0.4-1° being 1° or less. Particularly, the flank wear width is small, and the number of impacts is large in Sample Nos. 2 to 4, whose first layer has a thickness of 6-15 μm. A flank wear width is small and the number of impacts is large in Sample Nos. 1 to 4, whose first layer is made up of a first region composed of TiN and a second region composed of Ti(C$_x$N$_{1-x}$) (0<x<1), which are stacked in this order.

The flank wear width is small, and the number of impacts is large in Sample Nos. 2 to 4, whose first region has a thickness of 0.5-3 μm, and whose second region has a thickness of 5.5-14.5 μm.

DESCRIPTION OF THE REFERENCE NUMERAL

1 . . . cutting tool
2 . . . first surface
3 . . . second surface
4 . . . base member
5 . . . coating layer
6 . . . cutting edge
7 . . . first layer
8 . . . first region
9 . . . second region
10 . . . second layer
11 . . . third layer
12 . . . fourth layer

What is claimed is:

1. A coated tool, comprising:
a base member composed of cemented carbide; and
a coating layer located on a surface of the base member, the coating layer comprising a first layer which is in contact with the base member and contains Ti($C_xN_{1-x}$) ($0 \leq x \leq 1$),
wherein
a KAM average value of WC particles in a region extending to a depth of 5 μm from the surface of the base member is 1° or less, which is measured by electron backscatter diffraction (EBSD) method using a scanning electron microscope with an electron backscatter diffraction imaging system.

2. The coated tool according to claim 1, wherein the first layer has a thickness of 6-15 μm.

3. The coated tool according to claim 1, wherein the first layer comprises a first region in contact with the base member and a second region located on the first region, and
a carbon content of the first region is smaller than a carbon content of the second region.

4. The coated tool according to claim 3, wherein the first region has a thickness of 0.5-3 μm, and the second region has a thickness of 5.5-14.5 μm.

5. The coated tool according to claim 1, wherein the coating layer further comprises:
a second layer which is located on the first layer and contains Ti($C_xN_{1-x-y}O_y$) ($0<x<1$, $0<y<1$), and
a third layer which is located on the second layer and contains aluminum oxide.

6. The coated tool according to claim 1, wherein
the first layer comprises a columnar crystal of titanium carbonitride extending in a direction perpendicular to the surface of the base member, and
a width of the columnar crystal in a direction parallel to the surface of the base member is 0.4 μm or less.

7. The coated tool according to claim 1, wherein
a ratio of a carbon content in a region extending to a depth of 5 μm from the surface of the base member to a carbon content in a region extending to a depth of 200 μm or more from the surface of the base member is from 0.95 to 1.

* * * * *

UNITED STATES PATENT AND TRADEMARK OFFICE
CERTIFICATE OF CORRECTION

PATENT NO. : 10,837,104 B2  
APPLICATION NO. : 15/755589  
DATED : November 17, 2020  
INVENTOR(S) : Hayato Kubo Page 1 of 1

It is certified that error appears in the above-identified patent and that said Letters Patent is hereby corrected as shown below:

In the Specification

Column 5, Line 26; please change "apart" to --a part--

Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*